United States Patent
Zou et al.

(10) Patent No.: US 9,966,484 B2
(45) Date of Patent: May 8, 2018

(54) PROCESS FOR PREPARING PASSIVATED EMITTER REAR CONTACT (PERC) SOLAR CELLS

(71) Applicant: CSI CELLS CO., LTD, Suzhou, Jiangsu (CN)

(72) Inventors: Shuai Zou, Suzhou (CN); Weixu Long, Suzhou (CN); Xusheng Wang, Suzhou (CN); Guoqiang Xing, Suzhou (CN)

(73) Assignee: CSI CELLS CO., LTD, Jiangsu (CN)

( * ) Notice: Subject to any disclaimer, the term of this patent is extended or adjusted under 35 U.S.C. 154(b) by 0 days. days.

(21) Appl. No.: 15/514,287

(22) PCT Filed: Dec. 31, 2015

(86) PCT No.: PCT/CN2015/100097
§ 371 (c)(1),
(2) Date: Mar. 24, 2017

(87) PCT Pub. No.: WO2017/004958
PCT Pub. Date: Jan. 12, 2017

(65) Prior Publication Data
US 2017/0294545 A1   Oct. 12, 2017

(30) Foreign Application Priority Data
Jul. 9, 2015 (CN) .......................... 2015 1 0400159

(51) Int. Cl.
| H01L 31/0236 | (2006.01) |
| H01L 31/068 | (2012.01) |
| H01L 31/18 | (2006.01) |

(52) U.S. Cl.
CPC ...... *H01L 31/02363* (2013.01); *H01L 31/068* (2013.01); *H01L 31/1868* (2013.01)

(58) Field of Classification Search
CPC ............. H01L 31/068; H01L 31/02363; H01L 31/1868
See application file for complete search history.

(56) References Cited

U.S. PATENT DOCUMENTS

2010/0065117 A1* 3/2010 Kim .................... H01L 31/0236
                                                                     136/256
2010/0258173 A1 10/2010 Laia et al.
2012/0085965 A1* 4/2012 Doll ....................... C09K 13/08
                                                                       252/79.3
2013/0234072 A1* 9/2013 Yost .................. H01L 21/67086
                                                                       252/501.1
2013/0340824 A1* 12/2013 Oh .................... H01L 31/02168
                                                                       136/256
2014/0261666 A1* 9/2014 Stewart ............. H01L 31/02242
                                                                       136/256

FOREIGN PATENT DOCUMENTS

| CN | 101937944 A | 1/2011 |
| CN | 102403399 A | 4/2012 |
| CN | 102487105 A | 6/2012 |
| CN | 102751377 A | 10/2012 |
| CN | 103219428 A | 7/2013 |
| CN | 103603055 A | 2/2014 |
| CN | 104218123 A | 12/2014 |
| CN | 104393114 A | 3/2015 |
| CN | 104993019 A | 10/2015 |

OTHER PUBLICATIONS

Apr. 19, 2016 International Search Report issued in International Patent Application No. PCT/CN2015/100097.
Hoffmann et al., "Wet-Chemically Etched Silicon Nanowire Solar Cells: Fabrication and Advanced Characterization", Ch. 10, Nanowires, pp. 211-230, 2012.

* cited by examiner

*Primary Examiner* — Seahvosh Nikmanesh
(74) *Attorney, Agent, or Firm* — Oliff PLC

(57) ABSTRACT

A process for preparing a passivated emitter rear contact solar cell, which includes the steps as follows: removing the damaged layer on the surface of the silicon wafer and at the same time polishing both surfaces, texturing, forming PN junction, etching, removing the glass impurity, depositing a passivation film on the back surface, depositing a passivating antireflective layer on the front surface, making local openings on the back surface, screen printing of metal paste on both the front surface and the back surface and sintering, in which the texturing step employs a catalytic metal etching approach, and the textured structure is a nanometer-level textured structure. The present invention has combined removing the damaged layer on the surface of the silicon wafer and polishing both the front and back surfaces into one single step, and thus has simplified the production process and reduced the production cost.

10 Claims, No Drawings

PROCESS FOR PREPARING PASSIVATED EMITTER REAR CONTACT (PERC) SOLAR CELLS

TECHNICAL FIELD

The present invention relates to a process for preparing passivated emitter rear contact (PERC) solar cells, which belong to the solar cell technical field.

BACKGROUND ART

Conventional fossil fuels are gradually becoming depleted. Among the available sustainable energy sources, solar energy is undoubtedly one of the cleanest, most common and most promising alternative energy sources. Solar power generating devices, also known as solar cells or photovoltaic cells, are able to convert solar energy directly into electrical energy. Their power generation mechanism is based on the photovoltaic effect of semiconductor PN junction.

With the development of science and technology, a new type of solar cell, the passivated emitter rear contact (PERC) solar cell, has appeared. It is a type of newly developed, highly efficient solar cell that has attracted widespread attention from the industry. Its core technology is as follows: the back surface of a silicon wafer is covered with a thin film of alumina or silica (5 to 100 nm) to gain the functions of passivating the surface and improving long-wave response, so as to increase the conversion efficiency of the solar cell. However, since alumina and silica are not electrically conductive, openings need to be made at certain locations on the film in order to enable contact between the metal aluminum and silicon wafer surface to capture electric current. On the other hand, during the process of high temperature sintering, metal aluminum (typically aluminum paste) may compromise the passivation effect of alumina or silica. As a result, a silicon nitride film is used to further cover the top of the alumina or silica film in order to provide a protective function.

The process currently available for producing passivated emitter rear contact solar cells comprises the following major steps: removing the damaged layer on the surface of the silicon wafer, texturing, diffusion, back polishing, etching, removing the glass impurity, back surface depositing of alumina or silica film, depositing of con nitride protection film, front surface depositing of silicon nitride antireflective layer, making local openings on the back surface, screen printing of metal paste on both the front surface and the back surface, and sintering, so as to prepare a solar cell.

However, the preparation process described above has a few problems: (1) it has many steps in the preparing process, which leads to a relatively high production cost, and accordingly, it must be improved in order to reduce production cost; and (2) the photoelectric conversion efficiency obtained from such prepared passivated emitter rear contact solar cells is still relatively low, and thus there is room for further improvement.

SUMMARY OF THE INVENTION

One object of the present invention is to provide a process for preparing passivated emitter rear contact solar cells.

In order to achieve the object mentioned above, the present invention has employed the following technical solution: a process for preparing passivated emitter rear contact solar cells comprises the following steps: removing the damaged layer on the surface of the silicon wafer and at the same time polishing both surfaces, texturing, forming PN junction, etching, removing the glass impurity, depositing a passivation film on the back surface, depositing a passivating antireflective layer on the front surface, making local openings on the back surface, screen printing of metal paste on both the front surface and the back surface and sintering;

wherein the texturing step employs a catalytic metal corrosion approach, and the textured structure is a nanometer-level textured structure.

In addition, as mentioned above, the preparation process employs the catalytic metal corrosion approach, which is an existing technology in the art.

The surface reflectivity of the nano-meter level textured structure mentioned above is within a range of from 12% to 20%.

In the present invention, the step of removing the damaged layer on the surface of the silicon wafer and the step of polishing both the front and back surfaces have been performed in one single step, which not only achieves the aim of removing the damaged layer on the surface of the silicon wafer, but can also form the polished surface with back passivation. In this way, it is able to spare the back polishing step, which is typically carried out in the existing technology in the art following the diffusion step. As a result, the present invention has simplified the production process and reduced the production cost. On the other hand, the nanometer-level textured structure formed following the polishing step allows the next formed PN junction to be smoother, which helps to reduce junction recombination and increase open circuit voltage, as well as improve metal contact. As a result, it can increase open circuit voltage, and at the same time improve FF.

Preferably, the steps of removing the damaged layer on the surface of the silicon wafer and polishing both the front and back surfaces are carried out in an acidic liquid or in an alkali liquid, and the performance time is within a range of 2 to 20 minutes.

The acidic liquid mentioned above is a mixture of $HNO_3$ and HF, or a mixture of $H_2CrO_4$ and HF. The temperature thereof is within a range of from 5 to 45° C.

In the mixture of $HNO_3$ and HF, the ratio by volume of $HNO_3$ (69%)/HF (49%) or of $H_2CrO_4$ (60%)/HF (49%) is greater than 4:1.

The alkali liquid mentioned above is NaOH solution, KOH solution or tetramethylammonium hydroxide (TMAH) solution. The temperature thereof is within a range of from 5 to 95° C. In addition, the volumetric concentration of the foregoing alkali liquids is higher than 1%.

In the description provided above, the $HNO_3$ (69%)/HF (49%) refers to the $HNO_3$ with a volumetric concentration of 69% and the HF with a volumetric concentration of 49%.

In the description provided above, the $H_2CrO_4$ (60%)/HF (49%) refers to the $H_2CrO_4$ with a volumetric concentration of 60%, and the HF with a volumetric concentration of 49%.

The solution of tetramethylammonium hydroxide is also referred to as TMAH solution.

Preferably, the time duration for carrying out the step of removing the damaged layer on the surface of the silicon wafer and polishing both the front and back surfaces is within a range of 2 to 10 minutes.

In the technical solution mentioned above, the texturing step is carried out as follows: first, by placing the silicon wafer into a solution containing metal ions for soaking, so as to allow surfaces of the silicon wafer to be covered with a layer of nanometer metal particles;

and then using a chemical etching liquid to treat each of the surfaces of the silicon wafer, so as to form the nanometer-level textured structure, wherein the chemical etching liquid is a solution of hydrofluoric acid that contains an oxidant. The procedure mentioned above is the two-step catalytic metal etching process.

In the technical solution described above, the solution containing metal ions is a metal salt solution that contains hydrofluoric acid.

In the technical solution described above, alternatively, the texturing step is carried out as follows: placing the silicon wafer into a solution of hydrofluoric acid that contains both an oxidant and a metal salt, so as to form the nanometer-level textured structure on surfaces of the silicon wafer. The procedure mentioned above is the one-step catalytic metal etching process.

The metal ion mentioned above may be selected from the metal ions currently used in the existing technology, such as one or a combination selected from the group consisting of gold, silver, copper, nickel. In addition, the oxidant is selected from $H_2O_2$, $HNO_3$ and $H_2CrO_4$.

In the technical solution described above, the concentration of the metal ion in the solution is higher than $6E^{-5}$ mol/L.

Preferably, the size of the nanometer-level textured structure is within a range of from 100 to 900 nm.

In the technical solution described above, between the texturing step and the PN junction forming step, there is a step of correction etching of the textured surface microstructure, and the specific procedure is as follows: placing the silicon wafer with the textured surface into a chemical etching liquid for modification etching of the microstructure.

The chemical etching liquid mentioned above is selected from the group consisting of NaOH solution, KOH solution, tetramethylammonium hydroxide (TMAH) solution and a mixed solution of an acidic oxidant and HF acid.

In the procedure of modification etching of the microstructure on the silicon wafer surface with a chemical etching solution, an alkali liquid (NaOH solution, KOH solution, tetramethylammonium hydroxide (TMAH) solution or a mixed acidic solution (HF and $HNO_3$)) is used to perform the modification etching of the microstructure (linear structure or deep hole structure) on the nanometer-level textured surfaces previously formed. The alkali liquid is used to perform an anisotropic etching treatment on the linear or deep hole shaped microstructure. Such an anisotropic etching process is performed preferably along the original linear or deep hole shaped microstructure. Accordingly, the etching would lead to modification of the original linear or deep hole shaped microstructure into a corresponding angular nano-pyramid or nano-pit structure. Moreover, the fixed acid (HF and $HNO_3$) is used to perform an isotopic etching treatment on the linear or deep hole shaped microstructure. Such an isotropic etching process is performed preferably along the original linear or deep hole shaped microstructure as well. Accordingly, the etching would thither modify the corresponding nano-porous structure with larger porous diameter and shorter depth. By virtue of the modification etching mentioned above, a desirable nanometer-level textured structure is finally obtained.

In the technical solution described above, either prior to or following the foregoing modification etching on the textured surface microstructure, a metal particle removing step needs to take place. The specific procedure is as follows: using an acidic liquid and then deionized water to wash the obtained silicon wafer, so as to remove the metal particles.

The preparation method provided in the present invention can be used to make the solar cells by way of diamond cord cutting silicon wafer.

Due to the employment of the technical solution described above, when compared to the existing technologies available in the art, the present invention has the following advantages:

1. The present invention has developed a new process for preparing passivated emitter rear contact solar cells. In the present invention, the step of removing the damaged layer on the surface of the silicon wafer and the step of polishing both the front and back surfaces have been performed in one single step; that is to say, the step of removing the damaged layer on the surface of the silicon wafer and the step of double-sided polishing have been combined into one single step, which cannot only achieve the aim of removing the damaged layer on the surface of the silicon wafer, but can also form the polished surface with rear passivation. In this way, it is able to spare the back polishing step, which is typically carried out in the existing technology in the art following the diffusion step. As a result, the present invention has simplified the production process, reduced the production time, increased production efficiency and reduced the production cost. Therefore, the present invention allows for large-scale production of polycrystalline silicon PERC solar cells without increasing the production cost per watt of solar cell.

2. The present invention adopts a chemical etching approach to perform the double-sided polishing, and then forms the nanometer-level textured surface. In this way, it allows the PN junction formed following diffusion to become smoother, which helps to reduce junction recombination and increase open circuit voltage, as well as improve metal contact. As a result, it can increase open circuit voltage, and at the same time improve FF. As confirmed in experiments, in comparison to the existing technology available in the art, the efficiency of the polycrystalline silicon PERC solar cell provided in the present invention shows an increase of about 0.47%, and thus has achieved an unexpected technical result.

3. In the present invention, the front surface adopts a nanometer-level textured structure, which helps to reduce front surface reflectivity and increase short-wavelength absorption. The foregoing technology, when combined with rear passivation film formation, can achieve the aim of full band optical absorption, and thus has greatly increased the efficiency of polycrystalline silicon solar cells.

DESCRIPTION OF THE EMBODIMENTS

The present invention will be further described in detail in reference to certain exemplary embodiments.

Exemplary Embodiment 1

A process for preparing polycrystalline silicon PERC solar cells, comprising t following steps:

First, using a KOH solution of 2% mass concentration to remove a damaged layer on the surface of a polycrystalline silicon wafer and at the same time polishing both surfaces at a temperature of 70° C. for a time period of 6 minutes;

then carrying out a catalytic metal etching treatment on the polished silicon wafer to form a nanometer-level textured surface, wherein the size of the nanometer-level textured surface is within a range of from 300 to 500 nm, and the reflectivity thereof is 17%; the specific procedure of preparing the textured surface is as follows: placing the silicon wafer in a chemical etching liquid that contains metal ions, so as to form the nanometer-level textured surface on a surface of the silicon wafer, wherein the chemical etching liquid is a mixed solution of $H_2O_2$ containing silver ions and hydrofluoric acid, in which the metal ion concentration is higher than $6E^5$ mol/L; the concentration of $H_2O_2$ is 0.5 mol/L and the concentration of HF is 10 mol/L;

next, the silicon wafer with textured surface is placed in a diffusion oven for diffusion, wherein the diffusion temperature is from 800° C. to 840° C., the operating time period is from 60 to 90 minutes, and the block resistance is from 60 to 120 Ω/sq.;

next, carrying out back surface and edge etching on the diffused silicon wafer and removing a surface PSG layer;

next, carrying out an ALD deposition of $Al_2O_3$ passivation layer on the back surface of the etched silicon wafer, as well as an annealing treatment, next, carrying out a PECVD deposition of a SiNx film on top of the $Al_2O_3$ passivation layer;

next, carrying out a PECVD deposition of a silicon nitride antireflective layer on the front surface of the silicon wafer;

next, cutting local openings on the back surface using a laser;

finally, forming electrodes by way of screen printing and forming an Ohmic contact.

Comparative Example 1

In the comparative example, the same starting materials have been used to make the passivated emitter rear contact solar cells, and the preparation method mainly comprises the following steps: removing the damaged layer on the surface of the silicon wafer, texturing, diffusion, back polishing, etching, removing the glass impurity, back surface depositing of alumina or silica film, depositing of silicon nitride protection film, front surface depositing of silicon nitride antireflective layer, making local openings on the back surface, screen printing of metal paste on both the front surface and the back surface and sintering, so as to prepare the solar cell.

The solar cell made in the foregoing exemplary embodiment and the solar cell made in the comparative example have been further tested and the test results are as follows:

|  | Uoc (mV) | Jsc (mA/cm$^2$) | FF (%) | EFF |
| --- | --- | --- | --- | --- |
| Conventional polycrystalline silicon solar cell | 633.3 | 36.02 | 78.46 | 17.90% |
| Exemplary embodiment 1 | 641.4 | 36.80 | 77.82 | 18.37% |
| Comparative example 1 | 644.2 | 37.22 | 78.58 | 18.84% |

As shown in the table above, in comparison to comparative example 1, the efficiency of the polycrystalline silicon PERC solar cell prepared according to the present invention has been increased by about 0.47%, and thus an unexpected result has been achieved. In addition, it not only increases open circuit voltage, but also improves the fill factor (FF). It has indicated that the PN junction formed following diffusion is smoother, which can allow better metal contact.

What is claimed is:

1. A process for preparing a passivated emitter rear contact, comprising the following steps:
    removing a damaged layer on the surface of a silicon wafer and at the same time polishing both surfaces thereof, and subsequently:
    texturing, forming PN junction, etching, removing the glass impurity, depositing a passivation film on a back surface thereof, depositing a passivating antireflective layer on a front surface thereof, making local openings on the back surface, screen printing of metal paste on both the front surface and the back surface and firing; wherein
    the step of texturing employs a catalytic metal etching approach, and the textured surface structure is a nanometer-level structure with textured surface.

2. The preparation process as set forth in claim 1, wherein the step of removing a damaged layer on the surface of a silicon wafer and at the same time polishing both surfaces thereof is carried out in an acidic liquid or in an alkali liquid, where the operating time thereof is from 2 to 20 minutes; wherein
    when the step of removing a damaged layer on the surface of a silicon wafer and at the same time polishing both surfaces thereof is carried out in the acidic liquid:
        an operating temperature is within a range of from 5 to 45° C., and
        the acidic liquid is either
            a mixture of $HNO_3$ and HF, where a ratio by volume of $HNO_3$ (69%)/HF (49%) is greater than 4:1, or
            a mixture of $H_2CrO_4$ and HF, a ratio by volume of $H_2CrO_4$ (60%)/HF (49%) is greater than 4:1; or
    when the step of removing a damaged layer on the surface of a silicon wafer and at the same time polishing both surfaces thereof is carried out in the alkali liquid:
        the alkali liquid is selected from a NaOH solution, a KOH solution or a tetramethylammonium hydroxide (TMAH) solution,
        an operating temperature is within a range of from 5 to 95° C., and
        a volumetric concentration of the alkali liquid is higher than 1%.

3. The preparation process as set forth in claim 2, wherein the operating time of the step of removing a damaged layer on the surface of a silicon wafer and at the same time polishing both surfaces thereof is from 2 to 10 minutes.

4. The preparation process as set forth in claim 1, wherein the step of texturing comprises:
    first placing the silicon wafer into a solution containing metal ions for soaking, so as to allow surfaces of the silicon wafer to be covered with a layer of nanometer metal particles; and then
    using a chemical etching liquid to treat each of the surfaces of the silicon wafer, so as to form the nanometer-level textured structure, wherein the chemical etching liquid is a solution of hydrofluoric acid that contains an oxidant.

5. The preparation process as set forth in claim 4, wherein the solution containing metal ions is a metal salt solution that contains hydrofluoric acid.

6. The preparation process as set forth in claim 1, wherein the texturing step comprises:
    placing the silicon wafer into a solution of hydrofluoric acid that contains both an oxidant and a metal salt, so as to form the nanometer-level textured structure on surfaces of the silicon wafer.

7. The preparation process as set forth in claim 4, wherein the metal ion concentration in the solution is higher than 6E-5 mol/L.

8. The preparation process as set forth in claim 1, wherein between the texturing step and the PN junction forming step, the process further comprises a step of modification etching of the textured surface microstructure, which comprises:
    placing the silicon wafer with the textured surface into a chemical etching liquid for modification etching of the microstructure; wherein the chemical etching liquid is selected from the group consisting of
    NaOH solution,
    KOH solution,
    tetramethylammonium hydroxide (TMAH) solution, and
    a mixed solution of an acidic oxidant and HF acid.

9. The preparation process as set forth in claim 8, wherein either prior to or following the modification etching on the textured surface microstructure, the process further comprises a metal particle removing step, which comprises:
    using an acidic liquid and then deionized water to wash the obtained silicon wafer, so as to remove the metal particles.

10. The preparation process as set forth in claim 6, wherein a metal ion concentration in the solution is higher than 6E-5 mol/L.

\* \* \* \* \*